United States Patent [19]

Pollmann et al.

[11] Patent Number: 5,233,348

[45] Date of Patent: Aug. 3, 1993

[54] VARIABLE LENGTH CODE WORD DECODER FOR USE IN DIGITAL COMMUNICATION SYSTEMS

[75] Inventors: Stephen C. Pollmann, Santee; Paul Moroney, Olivenhain; Edward A. Krause; Paul Shen, both of San Diego; Woo H. Paik, Encinitas, all of Calif.

[73] Assignee: General Instrument Corporation, Hatboro, Pa.

[21] Appl. No.: 858,101

[22] Filed: Mar. 26, 1992

[51] Int. Cl.⁵ ............................................. H03M 7/40
[52] U.S. Cl. ........................................ 341/67; 341/65
[58] Field of Search ...................... 341/65, 67, 95, 106

[56]  References Cited

U.S. PATENT DOCUMENTS

| | | | |
|---|---|---|---|
| 3,701,111 | 10/1972 | Cocke et al. | 341/67 |
| 3,883,847 | 5/1975 | Frank | 341/65 |
| 4,725,815 | 2/1988 | Mitchell et al. | 341/67 |
| 5,138,315 | 8/1992 | LeQueau et al. | 341/67 |
| 5,138,316 | 8/1992 | Konishi | 341/67 |
| 5,140,322 | 8/1992 | Sakagami | 341/65 |

OTHER PUBLICATIONS

Ming L. Liou, "Visual Telephony as an ISDN Application," *IEEE Communications Magazine*, Feb. 1990.

*Primary Examiner*—Marc S. Hoff
*Attorney, Agent, or Firm*—Barry R. Lipsitz

[57] ABSTRACT

Apparatus is provided for decoding variable length code words to recover transform coefficients, such as DCT transform coefficients provided by a high definition television encoder. A first category of the code words has a length of no more than n bits. A second category has a length of greater than n bits. A feedback ROM is used to decode the code words. Code words from the first category are processed by directly addressing a lookup table in the ROM. Code words from the second category are processed using multiple passes through the ROM, wherein a portion of the data output during a prior pass is fed back to address the memory during a subsequent pass.

19 Claims, 7 Drawing Sheets

| ESCAPE CODE 1 | NUMBER OF ZEROS | MAGNITUDE | SIGN BIT |
|---|---|---|---|
| 8 BITS | 6 BITS | (M-1) BITS | 1 BIT |

60

| ESCAPE CODE 2 | MAGNITUDE | SIGN BIT |
|---|---|---|
| 6 BITS | (M-1) BITS | 1 BIT |

| RUNLENGTH | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| 0 | 2 | 3 | 5 | 5 | 6 | 7 | 7 | 8 | 8 | 9 | 9 | 9 | 10 | 10 | 10 | 10 |
| 1 | 3 | 5 | 6 | 8 | 8 | 9 | 10 | 10 | 11 | 12 | 12 | 13 | 13 | 14 | 14 | 14 |
| 2 | 4 | 7 | 8 | 9 | 11 | 11 | 12 | 13 | 14 | 14 | 15 | 15 | 16 | 16 | 17 | 17 |
| 3 | 5 | 8 | 10 | 11 | 12 | 13 | 14 | 15 | 16 | 16 | 17 | 18 | 20 | 19 | 18 | 19 |
| 4 | 6 | 9 | 11 | 13 | 14 | 15 | 16 | 17 | 18 | 19 | 20 | 21 | 21 | 21 | 28 | 20 |
| 5 | 6 | 10 | 12 | 13 | 15 | 16 | 18 | 18 | 20 | 20 | 22 | 22 | 28 | 28 | 21 | 22 |
| 6 | 7 | 10 | 13 | 14 | 16 | 18 | 19 | 20 | 22 | 21 | 28 | 29 | 22 | 29 | 22 | 21 |
| 7 | 7 | 11 | 13 | 15 | 16 | 17 | 20 | 20 | 21 | 29 | 22 | 21 | 21 | 18 | 20 | 22 |
| 8 | 8 | 12 | 14 | 16 | 18 | 20 | 20 | 21 | 29 | 29 | 29 | 29 | 29 | 29 | 29 | 29 |
| 9 | 8 | 13 | 16 | 18 | 20 | 20 | 29 | 29 | 29 | 29 | 29 | 29 | 29 | 29 | 29 | 29 |
| 10 | 9 | 13 | 17 | 19 | 20 | 21 | 18 | 20 | 22 | 29 | 29 | 29 | 29 | 29 | 29 | 29 |
| 11 | 9 | 13 | 16 | 16 | 22 | 21 | 22 | 21 | 28 | 28 | 28 | 28 | 28 | 28 | 28 | 28 |
| 12 | 9 | 15 | 18 | 21 | 28 | 28 | 28 | 28 | 28 | 28 | 28 | 28 | 28 | 28 | 29 | 28 |
| 13 | 10 | 16 | 20 | 28 | 28 | 28 | 28 | 28 | 29 | 29 | 29 | 29 | 29 | 29 | 28 | 28 |
| 14 | 11 | 17 | 20 | 28 | 28 | 28 | 28 | 29 | 29 | 29 | 29 | 29 | 29 | 29 | 29 | 29 |
| 15 | 11 | 18 | 21 | 29 | 29 | 29 | 29 | 29 | 29 | 29 | 29 | 29 | 29 | 29 | 28 | 28 |

AMPLITUDE

VARIABLE LENGTH CODE WORD DECODER FOR USE IN DIGITAL COMMUNICATION SYSTEMS

BACKGROUND OF THE INVENTION

The present invention relates to the recovery of compressed digital data, and more particularly to apparatus for decoding variable length code words.

Television signals are conventionally transmitted in analog form according to various standards adopted by particular countries. For example, the United States has adopted the standards of the National Television System Committee ("NTSC"). Most European countries have adopted either PAL (Phase Alternating Line) or SECAM standards.

Digital transmission of television signals can deliver video and audio services of much higher quality than analog techniques. Digital transmission schemes are particularly advantageous for signals that are broadcast by satellite to cable television affiliates and/or directly to home satellite television receivers. It is expected that digital television transmitter and receiver systems will replace existing analog systems just as digital compact discs have largely replaced analog phonograph records in the audio industry.

A substantial amount of digital data must be transmitted in any digital television system. This is particularly true where high definition television ("HDTV") is provided. In a digital television system, a subscriber receives the digital data stream via a receiver/descrambler that provides video, audio, and data to the subscriber. In order to most efficiently use the available radio frequency spectrum, it is advantageous to compress the digital television signals to minimize the amount of data that must be transmitted.

The video portion of a television signal comprises a sequence of video "frames" that together provide a moving picture. In digital television systems, each line of a video frame is defined by a sequence of digital data referred to as "pixels." A large amount of data is required to define each video frame of a television signal. For example, 7.4 megabits of data is required to provide one video frame at NTSC resolution. This assumes a 640 pixel by 480 line display is used with 8 bits of intensity value for each of the primary colors red, green and blue. High definition television requires substantially more data to provide each video frame. In order to manage this amount of data, particularly for HDTV applications, the data must be compressed.

Video compression techniques enable the efficient transmission of digital video signals over conventional communication channels. Such techniques use compression algorithms that take advantage of the correlation among adjacent pixels in order to derive a more efficient representation of the important information in a video signal. The most powerful compression systems not only take advantage of spatial correlation, but can also utilize similarities among adjacent frames to further compact the data. In such systems, differential encoding is used to transmit only the difference between an actual frame and a prediction of the actual frame. The prediction is based on information derived from a previous frame of the same video sequence. Examples of such systems can be found in U.S. Pat. No. 5,068,724 entitled "Adaptive Motion Compensation for Digital Television" and U.S. Pat. No. 5,057,916 entitled "Method and Apparatus for Refreshing Motion Compensated Sequential Video Images."

Motion estimation of a video signal is provided by comparing the current luminance block with the luminance blocks in the previous frame within a specified tracking range. The previous frame luminance block with the minimum total absolute change compared to the current block is chosen. The position of the chosen block is called the motion vector, which is used to obtain the predicted values of the current block. For additional coding efficiency, the motion vectors can be differentially encoded and processed by a variable length encoder for transmission as side information to a decoder. A low pass filter may be provided in the DPCM loop for the purpose of smoothing out the predicted values as necessary. In order to protect the coded bitstream from various kinds of random noise, a forward error correction scheme can be used.

There are two major categories of coding schemes for compressing the data rate by removing redundant information. These are "source coding" and "entropy coding." Source coding deals with source material and yields results that are lossy. Thus, picture quality is degraded when source coding is used. In implementing source coding techniques, either intraframe or interframe coding can be used. Intraframe coding is used for the first picture and for later pictures after a change of scene. Interframe coding is used for sequences of pictures containing moving objects. Entropy coding achieves compression by using the statistical properties of the signals and is, in theory, lossless.

A coding algorithm that uses both source coding and entropy coding has been proposed by the CCITT Specialist Group. See, e.g., "Description of Reference Model 8 (RM8)," Doc. No. 525, CCITT SG XV Working Party XV-4, Specialist Group on Coding for Visual Telephony, June, 1989. In the CCITT scheme, a hybrid transform/differential pulse coded modulation (DPCM) with motion estimation is used for source coding. The DPCM is not operative for intraframe coding. For entropy coding, both one- and two-dimensional variable length codings are used.

The discrete cosine transform (DCT) described by N. Ahmed, T. Natarajan, and K. R. Rao, "Discrete Cosine Transform," *IEEE Trans. Computer*, Vol. C-23, pp. 90–93, January 1974, is used in the CCITT system to convert the input data, which is divided into macroblocks and sub-blocks, into transform coefficients. The DCT transform is performed on the difference between blocks of current frame data and corresponding blocks of a predicted frame (which is obtained from the previous frame information). If a video block contains no motion or the predicted value is exact, the input to the DCT will be a null matrix. For slowly moving pictures, the input matrix to the DCT will contain many zeros. The output of the DCT is a matrix of coefficients which represent energy in the two-dimensional frequency domain. In general, most of the energy is concentrated at the upper left corner of the matrix, which is the low frequency region. If the coefficients are scanned in a zigzag manner, the resultant sequence will contain long strings of zeros especially toward the end of the sequence. One of the major objectives of this compression algorithm is to create zeros and to bunch them together for efficient coding.

To maintain efficiency, a variable threshold is also applied to the coefficient sequence before quantization. This is accomplished by increasing the DCT threshold when a string of zeros is detected. A DCT coefficient is set to zero if it is less than or equal to the threshold.

A uniform quantizer is used after the transform. The step size of the quantizer can be adjusted by the transmission rate as indicated by the occupancy of a buffer. When the transmission rate reaches its limit, the step size will be increased so that less information needs to be coded. When this occurs, a degraded picture will result. On the other hand, picture quality will be improved by decreasing the step size when the transmission rate is below its limit.

To further increase coding efficiency, a two-dimensional variable length coding scheme is used for the sequences of quantized DCT coefficients. In a given sequence, the value of a non-zero coefficient (amplitude) is defined as one dimension and the number of zeros preceding the non-zero coefficient (runlength) is defined as another dimension. The combination of amplitude and runlength is defined as an "event."

A shorter length code is assigned to an event which occurs more frequently. Conversely, infrequent events receive longer length codes. An EOB (end of block) marker is provided to indicate that there are no more non-zero coefficients in the sequence.

The coded coefficient values are multiplexed together with various side information such as block classification, quantization information, and differential motion vectors. Some of the side information may also be variable length coded. The resultant bitstream is sent to a buffer for transmission.

At a receiver, a variable length decoder is necessary to perform the inverse operation of the encoder and recover the transform coefficients. Although the architecture of the decoder is in general much simpler than the encoder, prior art decoders require substantial amounts of memory in order to store a code book that is required to convert the received code words back into the transform coefficients from which they were derived at the transmitter.

Variable length codes have been proposed in which no code word is the prefix of any other code word. This guarantees unique decodability of an incoming data stream. Compression is achieved when events that occur much more frequently than others are assigned the shortest code words. In the proposed CCITT video coding algorithm, the dimension of the event amplitudes is 256, and the runlength has a dimension of 64. A straightforward implementation of such a system would require a variable length code table having more than 16,000 entries. However, since more than 99% of the entries are statistically improbable, they can be represented by a 6-bit escape code followed by 14-bit fixed length fields, in which six bits are provided for runlength and eight bits are provided for amplitude. The resulting variable length code table contains only 128 entries, which is much easier to process. Indeed, the coding and decoding of such a variable length code can be accomplished using a lookup table stored in read only memory (ROM).

Decoding in such a scheme is somewhat complicated by the fact that the length of the variable length code must be determined before it can be decoded. Several techniques for variable length code decoding have been proposed in the past. See, e.g., U.S. Pat. No. 3,701,111 to Cocke, et al entitled "Method and Apparatus for Decoding Variable-Length Codes Having Length-Indicating Prefixes," and M. T. Sun, K. M. Yang, and K. H. Tzou, "High-Speed Programmable ICs for Decoding of Variable-Length Codes," Applications of Digital Image Processing XII, Andrew Tescher, Ed., Proc. SPIE Vol. 1153, August 1989. The latter article proposes a parallel approach employing a barrel shifter and programmable logic arrays (PLA) or content addressable memory/random access memory modules (CAM/RAM) for very large scale integration (VLSI) implementation of a variable length decoder.

The decoders proposed in the prior art have only been realizable in software simulations or using large amounts of discrete hardware components due to the high speed nature of real time digital video decompression. It would be advantageous to provide a variable length decoder that has the ability to process code words at real time video rates. It would be further advantageous to provide such a decoder that can be readily implemented in integrated circuit form. Still further, it would be advantageous to provide such a decoder that consumes only a small amount of power. Such a decoder would be particularly useful for consumer use, such as in a low cost high definition television receiver.

The present invention provides a variable length decoder having the aforementioned and other advantages.

SUMMARY OF THE INVENTION

In accordance with the present invention, apparatus is provided for decoding variable length code words to recover transform coefficients. The code words have the property that no code word is a prefix of any other code word. A first category of code words processed by the apparatus of the present invention has a length of no more than n bits. A second category of code words having a length of greater than n bits is also processed.

The apparatus includes memory means having an n bit address port and first and second pluralities of addressable memory locations. The first plurality of addressable memory locations contains amplitude, runlength and first control data for different code words. The second plurality of addressable memory locations contains feedback and second control data for portions of code words from the second category. Means are provided for decoding code words from the first category by inputting the code words to the address port for addressing the memory to output amplitude, runlength, and first control data therefor. Means are provided for decoding code words from the second category by inputting a first n bit portion of a second category code word to the address port for addressing the memory to output feedback and second control data therefor. Subsequent portion(s) of the second category code word are cyclically input to the address port together with the feedback data in response to the second control data. The subsequent portion(s) of the second category code word and the feedback data together provide an address of no more than n bits for addressing the memory. In response to this address, the memory outputs feedback and second control data for use in a next input cycle when at least one additional portion remains in the second category code word. Alternatively, the memory outputs amplitude, runlength and first control data for the second category code word when no additional portions remain therein. Means responsive to the second control data are provided for outputting a run coefficient for each portion of the second category code word that does not result in the output of amplitude, runlength and first control data.

The apparatus of the invention can further comprise clock means coupled to provide a clock signal to the memory means and the first and second category code word decoding means, for establishing successive clock cycles. During each clock cycle, at least one of (i) amplitude, runlength and first control data for producing an amplitude coefficient, and (ii) feedback and second control data for producing a run coefficient, is output from said memory means. The run coefficient can comprise, for example, data indicative of a zero contained in the sequence of zero coefficients having its length specified by the runlength. The provision of the clock means enables one coefficient to be produced from the variable length code words for every clock cycle.

In an illustrated embodiment, the second category code word decoding means comprise multiplexer means responsive to the second control data for inputting feedback data for a second category code word to a predetermined plurality of address port inputs instead of inputting code word data to said inputs. A remaining plurality of address port inputs receive a corresponding portion of the second category code word. The feedback data can have a bit length, for example, of n/2, with the corresponding portion of the second category code word having a bit length of no more than n/2.

The apparatus can further comprise means for detecting special case code words for which amplitude and runlength data is not provided in the memory means. Means responsive to the detecting means decodes the special case code words. For example, a special case code word can be provided to indicate that there is no runlength associated with the code word. Another special case code word can indicate that the received data is uncoded, and can be recovered directly.

In an illustrated embodiment, the memory means provided in the variable length decoder have a storage capacity that is substantially equal to $2 \times n^n$. Also, the subsequent portion(s) of the second category code word can have a bit length that is the lesser of the number of unprocessed bits remaining in the code word or n/2, with the feedback data having a bit length of n/2.

The memory means can be configured as a first lookup table and a second lookup table. The first lookup table contains the addressable memory locations in the first plurality thereof that correspond to the first category code words, and the addressable memory locations in the second plurality thereof that correspond to the first n bit portions of the second category code words. The second lookup table contains the addressable memory locations in the first plurality thereof that correspond to the second category code words and the addressable memory locations in the second plurality thereof that correspond to the subsequent portions of the second category code words. The memory means can comprise an additional address port for receiving a control bit that selectively couples data at the n bit address port to either the first lookup table or to the second lookup table. In a preferred embodiment, the first and second lookup tables each have a storage capacity of substantially $2^n$ words.

The apparatus of the present invention can comprise a barrel shifter having an input for receiving the code words. The barrel shifter is responsive to shift length information contained in the first and second control data for outputting code words and portions thereof to the n bit address port. The shift length information is indicative of whether the decoding of a code word has been completed. Means responsive to the shift length information initiate the decoding of new code words.

In the illustrated embodiment, the code words are Huffman code words derived from discrete cosine transform coefficients.

A feedback memory is also provided in accordance with the present invention for use in decoding variable length code words. A first lookup table is addressable by first code words of no more than n bits in length or by up to the first n bits of second code words exceeding n bits in length. A second lookup table is addressable by a combination of p bits of feedback data and an m bit or smaller portion of a second code word, where p+m is $\leq n$ and the m bit or smaller portion follows the first n bits of the second code words. The first lookup table contains amplitude and runlength data for the first code words, as well as feedback data for an initial n bit or smaller portion of the second code words. The second lookup table contains amplitude and runlength data for a final m bit or smaller portion of the second code words, as well as feedback data for any m bit portions of the second code words that reside between the initial and final portions thereof. The memory can further comprise an n bit address port for receiving code words and feedback data. Means are provided for selectively coupling the address port to address the first lookup table or second lookup table.

A method is provided for decoding a plurality of successive variable length code words, including code words that represent events having zero runlength (i.e., nonzero amplitude only). First code words of up to n bits in length are decoded in a single clock cycle. Second code words of greater than n bits in length are decoded in a plurality P of clock cycles. The second code words represent events that have runlengths of at least P-1. A special escape code prefix is included in third code words that represent events which have no runlength. The third code words are decoded in one clock cycle in response to the detection of the special escape code prefix. In a preferred embodiment, the first and second code words are decoded using a lookup table to provide corresponding amplitude and runlength data. The third code words are decoded by directly outputting amplitude data without reference to said lookup table.

BRIEF DESCRIPTION OF THE DRAWINGS

FIG. 8 is a matrix illustrating the length of each code word in bits, for code words having runlengths of up to 15 and amplitudes of up to 16.

DETAILED DESCRIPTION OF THE INVENTION

Figure 1:
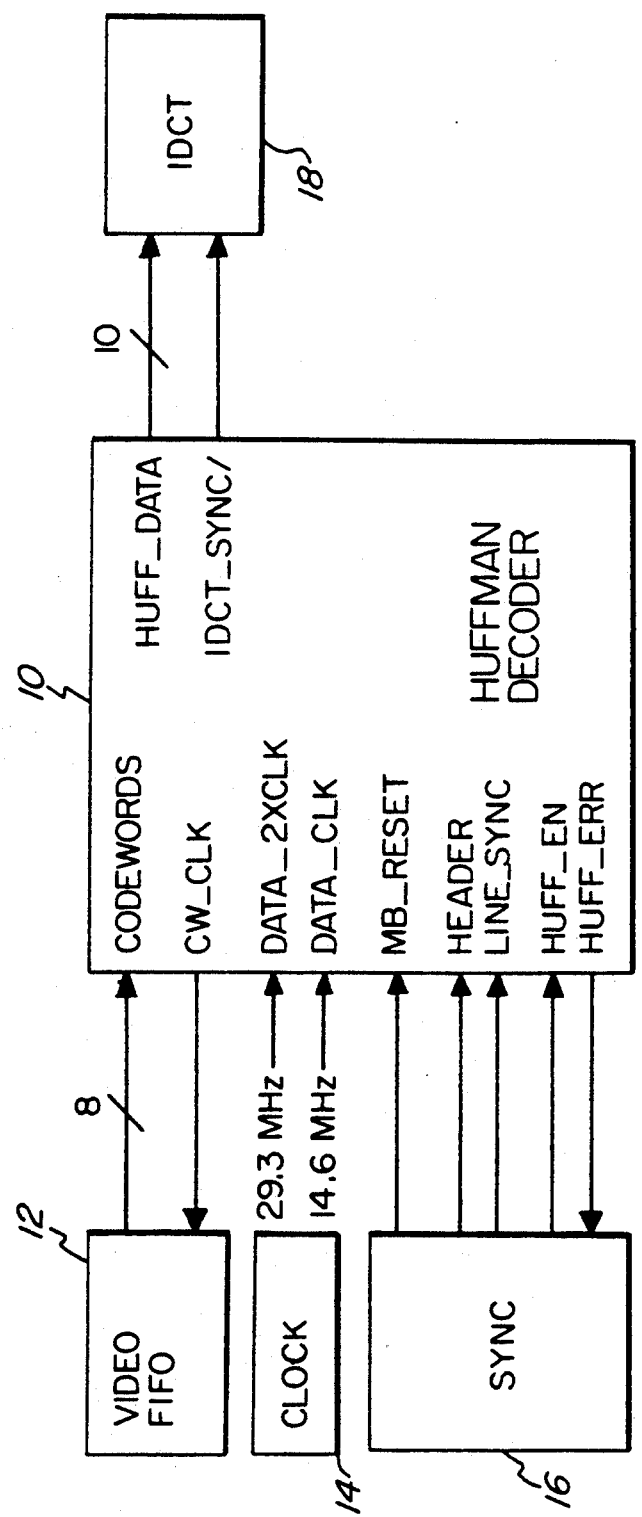
FIG. 1 is a block diagram of a HDTV receiver embodying a variable length (Huffman) decoder in accordance with the present invention.

The present invention provides apparatus for decoding variable length code words. Although the invention is described in connection with the decoding of Huffman code words, those skilled in the art will appreciate that the invention as described and claimed has broad application to decoders for other types of variable length code words.

The technique of quantization improves the compressibility of an image by reducing the amplitude of the transform coefficients. In order to take advantage of the result, an algorithm for assigning a variable number of bits to these coefficients is required. The variable length code word algorithm can comprise a statistical coding technique, which unlike the quantization process is information preserving and does not degrade the image.

Huffman coding is an optimum statistical coding procedure capable of approaching the theoretical entropy limit, given a prior knowledge of the probability of all possible events. The encoder can generate such probability distributions and send them to the decoder prior to the transmission of a given frame. This table is then used to derive Huffman code words where relatively short code words are assigned to events with the highest probability of occurrence. The decoder maintains an identical code book and is able to match each code word with the actual event. In the embodiment described in connection with the present invention, a fixed Huffman table is used to simplify hardware implementation. The Huffman table has been generated based on a wide variety of processed video information.

The illustrated embodiment of the invention applies Huffman coding using 8×8 blocks of DCT coefficients that are serialized into a sequence of 64 coefficients, and amplitude/runlength coded. Scanning the sequence of 64 coefficients, an "event" is defined to occur each time a coefficient is encountered with an amplitude not equal to zero. A code word is then assigned to the event indicating the amplitude of the coefficient and the number of zeros preceding it. The number of preceding zeros is referred to as the "runlength." FIG. 8 illustrates a two-dimensional amplitude/runlength array, wherein the bit length of each code word having a given amplitude 140 (up to 16) and runlength 130 (up to 15) is identified. FIG. 8 illustrates the number of bits in the code words. The amplitudes are provided in absolute value terms only. The sign bit which must also be included with each code word has not been added to the code word lengths.

When the coefficient amplitude is greater than 16 or the number of runlength zeros is more than 15, a special code word is used to tell the decoder not to use the code book to interpret the bits that follow. Instead, the runlength is sent uncoded. The coefficient amplitude is also sent uncoded with the number of bits determined by the quantization process described previously. In addition, it is sometimes more efficient to directly code the amplitude and runlength even if it can be coded through the use of the two-dimensional table illustrated in FIG. 8. The encoder detects these occasions and switches to direct coding if necessary to shorten the length of the code word to be transmitted. The directly coded code words are identified by the decoder as special case code words, via an escape code prefix. These special case code words are directly decoded without reference to the code book.

A special code word is also reserved to indicate the end of a block. It is always inserted after the last non-zero coefficient in a block of DCT coefficients. In addition, the DC coefficient is Huffman coded after it is differentially coded within a superblock. A superblock is defined as a video image area that is four luminance blocks horizontally by two luminance blocks vertically, and is associated with one chrominance block each for U and V derived from that image area. Each luminance and chrominance block is an image area comprising eight pixels horizontally by eight pixels vertically. See, e.g., W. Paik, "DigiCipher-All Digital, Channel Compatible, HDTV Broadcast System," *IEEE Transactions of Broadcasting*, Vol. 36, No. 4, December 1990, incorporated herein by reference. This scheme makes use of the high correlation of DC coefficients within a macroblock (i.e., an image area comprising eight superblocks horizontally) and further improves the compression efficiency.

The efficiency of the coding process is heavily dependent on the order in which the DCT coefficients are scanned. By scanning from high amplitude to low amplitude, it is possible to reduce the number of runs of zero coefficients typically to a single long run at the end of the block. The coefficients are therefore zigzag scanned going down first from the DC coefficient. As indicated above, any long run at the end of the block is represented efficiently by an end-of-block code word.

In accordance with the present invention, the Huffman code words are partitioned into four types. The first type encompasses code words having DCT coefficient amplitudes from 1-16, with a runlength from 0-15, and which have code word lengths of twenty-two or less. These are illustrated in the matrix 132 of FIG. 8. The second type of code word is from the set of runlengths from 1-64 and DCT amplitudes that range from 17-256. These are either outside of the matrix of FIG. 8 or within the matrix but have code word lengths of twenty-three or greater. The third type of Huffman code word falls into the same category as the second type, except for runlengths of zero. The fourth type of Huffman code word is the end-of-block code word.

In the specific embodiment illustrated, the Huffman decoder is designed to process a 15-bit code word in one 68 nanosecond cycle of a 14.6 MHz clock. Huffman code word lengths from the first type, with zero runlength, are all ten bits or less as can be seen from the first row 134 of FIG. 8. The present invention enables the processing of these code words and other code words of no more than ten bits, to be provided without interruption. In the event that a Huffman code word has a length of greater than ten bits, the apparatus of the present invention maintains a constant uninterrupted flow of coefficients by requiring such code words to represent at least two or more DCT coefficients. DCT coefficients which are not preceded by zero value coefficients and which fall outside the range of the DCT amplitudes for the first type of code words defined above have a maximum code word length of 15 bits. These are special zero runlength code words that can also be decoded in one 68 nanosecond clock cycle in accordance with the present invention.

A simplified block diagram of a Huffman decoder in accordance with the present invention is provided in FIG. 1. Huffman decoder 10 receives code words from a video first-in first-out (FIFO) register 12. The video FIFO outputs the code words to Huffman decoder 10 on an eight-bit code word bus. The Huffman decoder has the capability to process 15-bit code words in a 68 nanosecond period by clocking in eight bits of data at a time at a rate of 34 nanoseconds. This "2×" clock provides code words at the required rate of processing, but allows an eight-bit bus interface to the Huffman decoder to reduce the cost of the code word interface random access memory (RAM) which is used to store the code words before processing. The 2× clock, which runs at 29.3 MHz, is synchronized to the 14.6 MHz clock, and reduces the cost of the code word RAM by about 50% The 14.6 MHz clock ("DATA_CLK") and 29.3 MHz clock ("DATA_2× CLK") are output from a conventional clock circuit 14.

To ensure that any error made by the Huffman decoder does not propagate indefinitely, the decoder is reset by a synchronization circuit 16 for each macroblock. A macroblock reset signal ("MB_RESET") is provided by the synchronization circuitry during a horizontal blanking interval of the video signal being processed when the Huffman decoder is not enabled. This allows the synchronization circuitry to reset a serial access memory port to the first word of the next macroblock and provide information about the quantization levels, and PCM mode data blocks. The PCM mode data blocks are data blocks that are not differentially encoded (i.e., for which motion compensation was not selected). After the static access memory port is ready, the MB_RESET signal is asserted, which alerts the Huffman decoder that data is ready to be read from the video FIFO 12. The synchronization circuitry 16 must delay the enabling of the Huffman decoder for the time period required for the decoder to flush and fill its internal registers. After this time period, the synchronization circuitry may enable the Huffman decoder and expect valid data at its output port for inverse DCT transform processing (IDCT) by an inverse transform circuit 18. During normal processing of a superblock, the Huffman decoder 10 will receive data via a header containing quantization information and PCM mode information for the next superblock. At the end of a macroblock, the synchronization circuitry 16 will disable the Huffman decoder and restart the macroblock synchronization process. An IDCT sync signal from the Huffman decoder is provided to the inverse transform circuit 18 on the first coefficient of every block.

Should an error be detected in the Huffman decoder, a Huffman error detect signal ("HUFF_ERR") will be output to the synchronization circuitry 16. A line synchronization ("LINE_SYNC") is provided from synchronization circuitry 16 to the Huffman decoder and is synchronized with the header information and the 14.6 MHz clock. This signal is used to inform the Huffman decoder that the first bit of the header is ready to be read.

Figure 2:
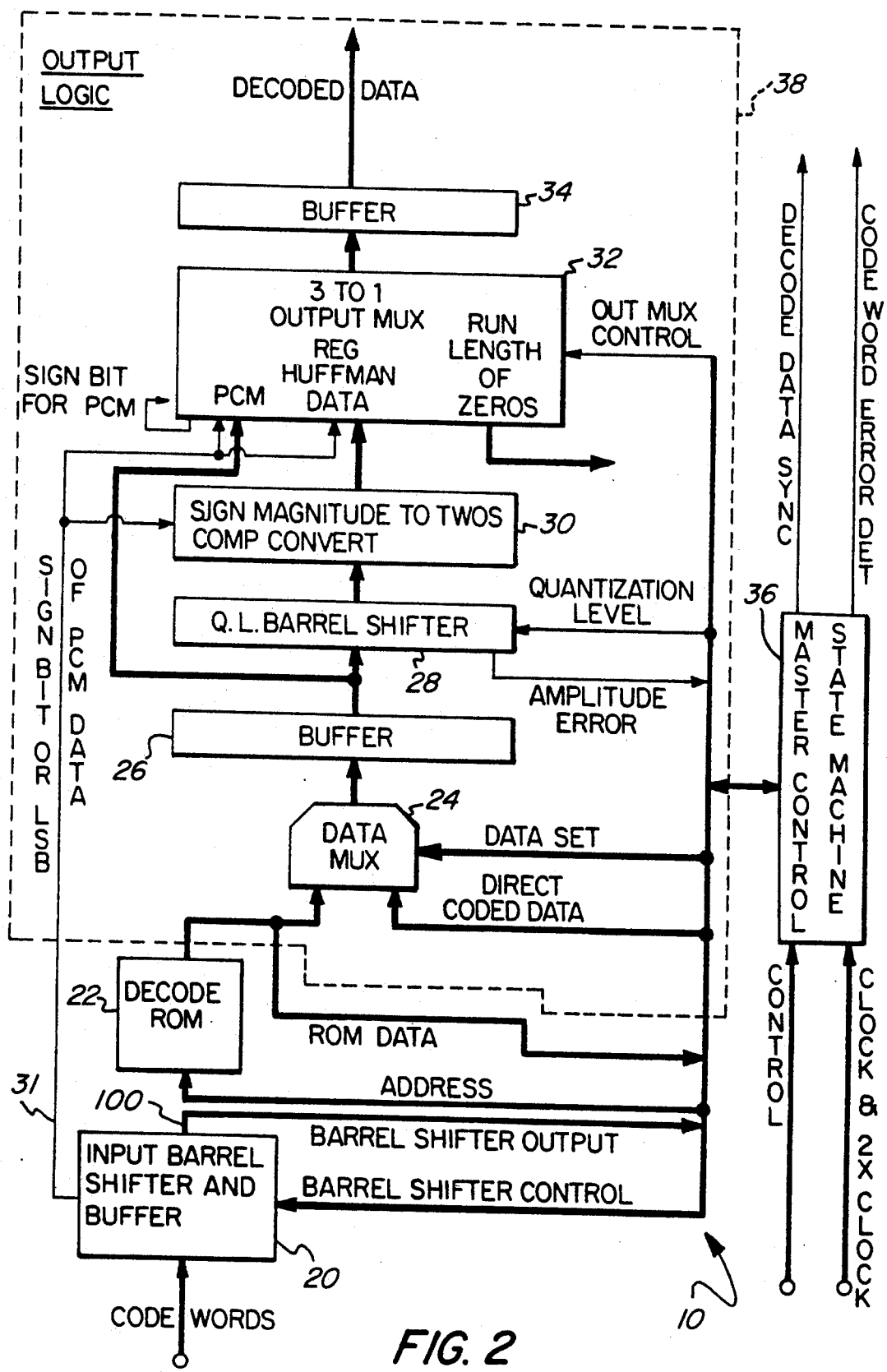
FIG. 2 is a more detailed block diagram of the Huffman decoder of FIG. 1.

The purpose of Huffman decoder 10 is to translate variable length code words received from an encoder into DCT coefficients for transformation into video data. FIG. 2 is a more detailed block diagram of the Huffman decoder. As noted in connection with FIG. 1, the Huffman decoder receives Huffman code words that are to be translated into video data from a video FIFO 12 (e.g., a VRAM). The code words are input to an input barrel shifter and buffer 20 (FIG. 2) which is described in detail below in connection with FIG. 3. The function of the input barrel shifter is to bring in the variable length data from the video FIFO and feed it to an address port of a decoder ROM 22. The ROM contains all of the necessary information for code word conversion. It should be noted that data is not always retrieved through the ROM; sometimes it is extracted directly from the data stream.

The selection of data, depending on the current state and the data read from the ROM, is controlled by a master control state machine 36. For most code words, data is latched from data multiplexers 24 after it has been decoded from the word provided by the input barrel shifter 20 in one clock cycle. During the time that a code word is being decoded, data that was latched at the previous clock cycle is routed through an inverse quantization barrel shifter 28 and a sign magnitude to twos complement conversion is effected by conventional conversion circuitry 30. The inverse quantization barrel shifter 28 is used to renormalize the data to its equivalent magnitude before it was encoded. After the inverse normalization, the data is converted from sign magnitude to twos complement. The resultant twos complement data from circuitry 30 is input to a three to one output multiplexer 32 that is controlled by the state machine 36 to output either runlength zero data, regular Huffman data received from circuitry 30, or PCM data received from buffer 26 prior to inverse quantization. The appropriate output data is buffered in a buffer 34 and output to the inverse DCT circuitry 18 illustrated in FIG. 1.

Figure 3:
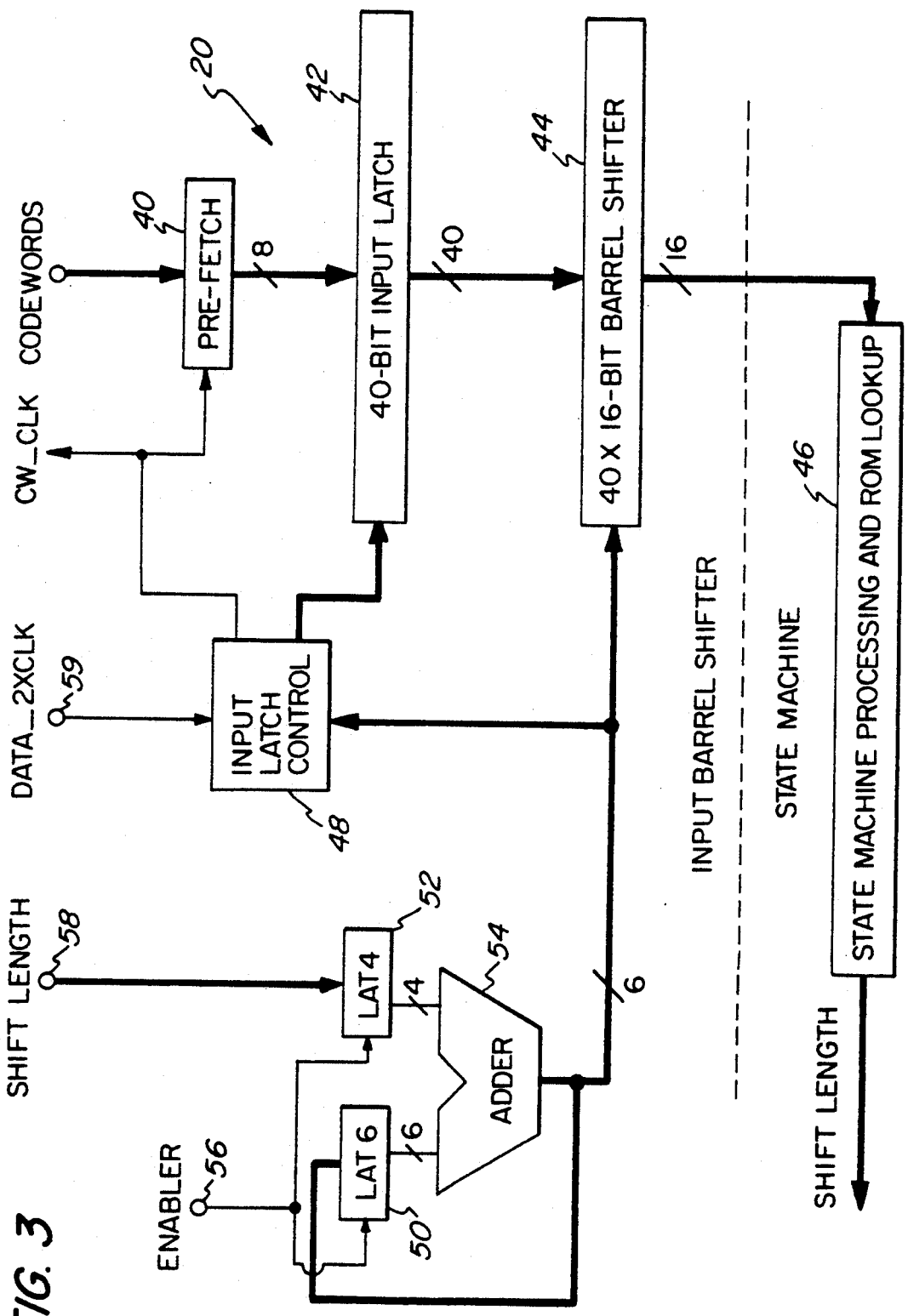
FIG. 3 is a detailed block diagram of the input barrel shifter and buffer subsystem of FIG. 2.

FIG. 3 is a block diagram of the input barrel shifter 20 used in the Huffman decoder of FIG. 2. Eight-bit code word data is input from the video FIFO 12 via a "prefetch" circuit 40, that buffers code word data fetched from the relatively slow video FIFO so that it is immediately available to the barrel shifter upon receipt of a code word clock (CW_CLK). The function of the input barrel shifter is to receive the variable length code words from the video FIFO and output the code word data in an orderly fashion for processing by the state machine. Initially, the barrel shifter pipeline has to be filled before processing by the state machine can commence. The barrel shifter takes forty bits of data into a 40-bit input latch 42 and selects 16 bits of the data using a 40×16-bit barrel shifter 44. The barrel shifter 44 outputs sixteen bits at a time to the state machine processing and ROM lookup circuitry 46. The barrel shifter can shift from one to forty bit positions in any one clock cycle.

The barrel shifter provides data for primarily two functions. The first function is to route data to address ROM 22 (FIG. 2) in order to output amplitude, runlength and first control data or feedback and second control data for code words or portions of code words. ROM 22, along with state machine 36 (collectively referred to as state machine processing and ROM lookup 46 in FIG. 3) determines the next Huffman decoder function and returns a shift length back to the barrel shifter.

Figures 4, 5, 6:
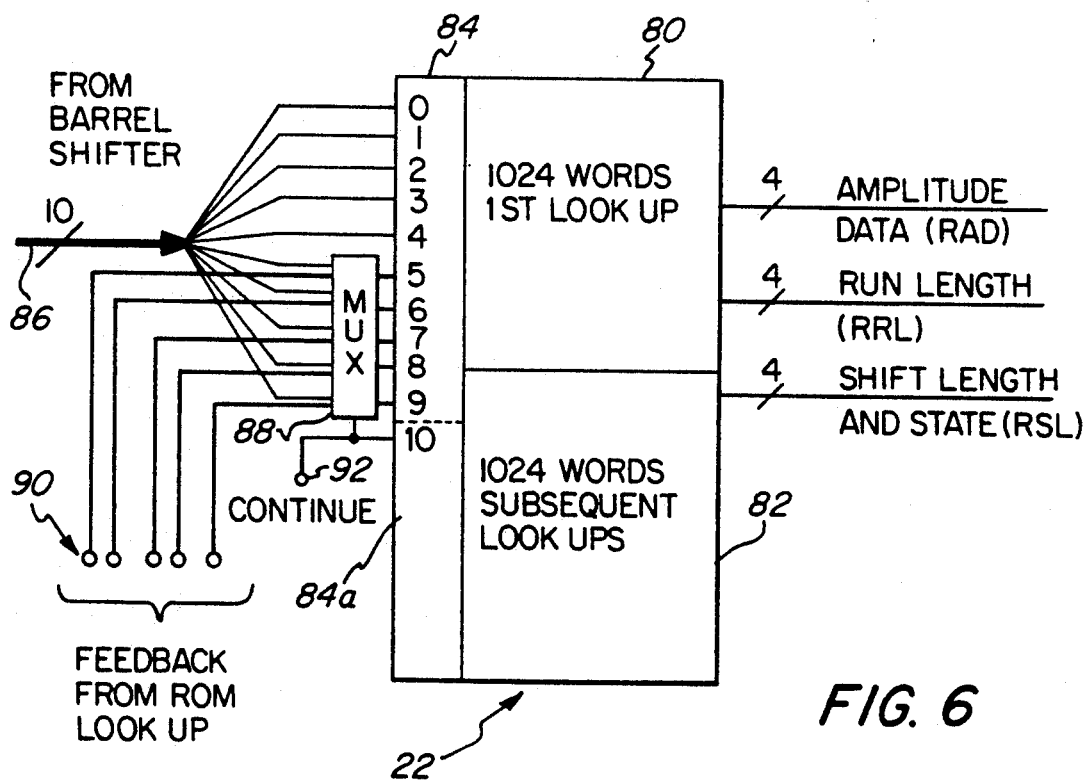
FIG. 4 is an illustration of a first special case code word (escape code) used in cases where the bit length of a code word is greater than 22 bits.
FIG. 5 is an illustration of another escape code format used when the runlength between consecutive code words is zero.
FIG. 6 is a more detailed block diagram of the read only memory decode (ROM) illustrated in the decoder of FIG. 2.

The second function of the barrel shifter is to route data for direct processing. For data identified by a special escape code prefix or for PCM data, the data from the barrel shifter is pulled off directly and processed as if it were provided from the ROM, even though it is not. One such escape code prefix 60 illustrated in FIG. 4 is used for all events for which the matrix of FIG. 8 produces greater than a predetermined number of bits, or for code words that are outside of the bounds of the amplitude/runlength matrix of FIG. 8. In the illustrated embodiment, escape code prefix 60 is used for all FIG. 8 entries greater than 22 bits in length, although those skilled in the art will appreciate that a specific implementation may use a cutoff of greater or less than 22 bits.

Escape code prefix 70 illustrated in FIG. 5 is used in cases where there is no runlength, i.e., when the code word data is indicative of consecutive nonzero amplitudes. In such cases, ROM 22 does not contain data pertinent to the code word, so the code word must be processed directly. The use of a special escape code prefix for cases where there is no runlength enables consecutive "amplitude only" code words to be processed at the rate of one code word per cycle, without bogging down the system when a greater than ten-bit code word is presented. Without such an escape code prefix, a code word that cannot be processed by ROM 22 in one cycle would not be able to be processed in adherence to the system throughput requirements, since there are no runlength associated zeros available to be output during extra processing cycles.

The shift length from the state machine processing and ROM lookup circuitry 46 is input to the barrel shifter via an input terminal 58. The shift length is latched in a four-bit latch 52 before being passed on to an adder 54. The other input to adder 54 comprises a six-bit word from latch 50 that is fed back from the output of adder 54. An enable signal input to terminal 56 enables latches 50 and 52. The enable signal can simply be the 14.6 MHz data clock that provides the timing for the Huffman decoder operation.

In order to process 16 bits of data in the equivalent of one 68 nanosecond clock cycle, the DATA_2X-CLK (29.3 MHz) is input to terminal 59 to clock an input latch control 48. Input latch control 48 generates the CW_CLK signal that is used to fetch the code words from the video FIFO, and also clocks the data output from pre-fetch circuit 40 into the 40-bit input latch 42. To accomplish this, input latch control 48 shifts eight bits at a time from the pre-fetch circuit using five triggers to fill latch 42 with a total of forty bits.

The shift lengths sent to the input barrel shifter from the state machine will range from 1-15 bits. Adder 54 will always add one extra bit of shift because a code word length of sixteen bits (the maximum length permitted) cannot be coded in a four-bit word. Also, during normal Huffman processing, code words are always followed by a sign bit. Therefore, the length of the Huffman code word is stored in ROM 22, and the barrel shifter is used to increment past the sign bit. The sign bit is preserved for conversion of the latched amplitude from sign magnitude to twos complement. As illustrated in FIG. 2, the preserved sign bit is input to converter 30 via line 31.

In accordance with the present invention, it is essential for the input barrel shifter module to process a code word or portion thereof once every clock cycle. This ensures that the decoder will be able to put out at least one of amplitude data, runlength data, and a run coefficient (e.g., a zero) during each successive clock cycle, thereby providing a coefficient from the variable length code words for every clock cycle. The logic path required during normal operations to achieve the one coefficient per clock cycle operation, assuming a precharged ROM, can be expressed as:

Lat 6 + Adder + Barrel Shifter + Lookup + ROM + Muxselectlogic + Sllogic < 68 ns Muxselectlogic refers to the portion of state machine 36 that controls output multiplexer 32, and Sllogic refers to the portion of the state machine logic that outputs the shift length determined from ROM 22 or from an escape code. "Lat 6" is latch 50, "Adder" is adder 54, "Barrel Shifter" is barrel shifter 44, and "Lookup+ROM" refers to the time it takes to process a data lookup from ROM 22. The 68 ns time requirement is established by the period of the 14.6 MHz clock.

A key component of the decoder provided by the present invention is the lookup ROM 22. The ROM subsystem is illustrated in greater detail in FIG. 6. The main function of the ROM is Huffman code word decoding. The ROM contains all of the information necessary for decoding code words other than those including a special escape code prefix. The data that goes into the ROM storage locations is derived from the runlength/amplitude matrix illustrated in FIG. 8. As indicated above, this matrix is generated from statistically selected sections of video. The matrix shows the number of bits allocated for each Huffman code word in relation to the runlength and amplitude of the code word, and its frequency of occurrence in the selected sections of video. ROM 22 is designed to decode Huffman code words having lengths specified in the matrix of FIG. 8. Specifically, all Huffman code words having a length of ten or fewer bits as illustrated in FIG. 8 will be decoded by one pass through the Huffman decoder. Code words having a bit length of greater than 10 but less than 23 bits will be decoded by multiple passes through the decoder. In such cases, data output from ROM 22 is fed back to address the ROM on subsequent cycles, until an entire code word has been decoded.

The actual building of the ROM entries is a straightforward process that involves the selection of a specific set of code words that the ROM will be able to decode, and then entering data pertaining to the selected code words into ROM locations having addresses that correspond to the bits in the selected code words. For code words of no more than ten bits, the ROM data corresponding to the code word will be amplitude, runlength, and associated control (e.g., shift length) data. For code words exceeding ten bits in length, the ROM data will comprise feedback and associated control data for all but the final pass through to ROM. The feedback data, when used together with a subsequent portion of the code word, will address a ROM location that stores data for use in pointing to another ROM location in the next feedback cycle, or in the event that no more feedback cycles are required, will address the ROM location that stores the actual amplitude and remaining runlength data for the code word. Those skilled in the art will appreciate that the actual programming of the ROM with the necessary amplitude, runlength, feedback and control data for the selected code words can be accomplished using a relatively simple computer program. For code words of ten or fewer bits, the program will simply provide the actual amplitude, runlength and control data for the code word. For code words of more than ten bits, the program will analyze the code word, break it down into successive portions of ten or fewer bits, and generate feedback and control data for all but the final portion of the code word. For the final portion of the code word, the program will provide the actual amplitude, remaining runlength and final control data for the code word.

It is important to note that code words longer than ten bits must originate from events having a runlength of one or larger. The reason for this is that for each clock cycle, one coefficient must be generated at the output of the Huffman decoder. If a code word is associated with an event having zero runlength, it must be decoded in one clock cycle. If a code word is associated with a runlength of one or greater, a zero can be sent to the output during the first processing cycle, and the rest of the code word can be further processed during the next processing cycle.

It is possible to equip the Huffman decoder with special hardware to process 11-bit code words in one clock cycle. In order to accomplish this, a ROM must be used with 11 address bits. Such a ROM will have a size of 2048 words. If code words longer than 11 bits are to be processed by the same ROM, another bit must be added to the address. This makes a ROM of 4096 locations. Logic can be added to process special 11-bit code words with zero runlengths and still keep the ROM size at 2048 words. The special 11-bit words are flagged in the ROM by the ten most significant bits (MSB) for each pair of 11-bit Huffman code words. It is important that each pair of 11-bit code words have the same ten-bit prefix so that the state machine and control logic can effectively decode these special code words. The ROM contains a shift length of 11 for these words and the special processing is carried out by the state machine.

If a code word is not one of the special 11-bit code words and it is longer than ten bits, it can be processed in two ROM lookups if it is shorter than 16 bits and has a runlength of one or greater associated with it. The code word can be processed without interrupting the data stream by latching an amplitude of zero while the second lookup is being processed. If a code word is longer than 15 bits, it must have a runlength of at least two associated with it. Runlengths of two will allow operation for code bits to 20 bits can be processed in three ROM table bits to 20 bits can be processed in three ROM table lookups. On each of the first and second lookups, a zero is latched. A third lookup will terminate the search for code words with lengths ranging from 16 bits to 20 bits. This process is similar for code words that are 21 and 22 bits long. These code words will take four lookups, and must have at least three runlength zeros associated with them. In all multiple lookup words, the ROM shift length field will contain only shift information, a code designating an invalid code word, or a predefined value (e.g., 15) that indicates that more lookups are necessary to terminate the code word. For the illustrated embodiment, in cases where the bit length is greater than 22 bits, the escape code prefix 60 illustrated in FIG. 4 will be used. This is because the maximum length of an escape code word (i.e., escape code prefix appended to it) is 23 bits.

ROM 22 is sectioned such that the first 1024 data words are used for the first lookups. The next 1024 data words are used for subsequent lookups. This is illustrated in FIG. 6, which shows a first lookup table 80 and a second lookup table 82. In the FIG. 6 embodiment, output bits 0–3 are used for amplitude data (RAD), output bits 4–7 are used for runlength data (RRL), and output bits 8–11 are used for shift length and state machine data (RSL). On the first lookup for each code word, ten bits of the code word received from the barrel shifter via data bus 86 will be used to directly address ROM 22 via a ten-bit address port 84. A supplemental address port 84a is provided to accommodate an additional bit as will be discussed below. If the code word is longer than ten bits, and is not a special 11-bit word, a new address will be built from five more new bits from the barrel shifter along with five bits fed back from the ROM for input to terminals 90 and an additional sixth bit referred to as a "continue" bit, that is input to terminal 92. The six bits will come from the amplitude data field (data bits 0–3) and the runlength field (data bits 4 and 5). Bits 0–4 are fed back by latching them on the first clock, and multiplexing them into the address of the ROM using a multiplexer 88 during the next clock. Bit zero is fed into bit five of the ROM address port, bit one is fed into bit six of the address port, etc. Processing of the sixth bit is handled in the same manner.

As noted above, the feedback bits are input to MUX 88 via terminals 90. The operation of MUX 88 is such that during a first clock cycle for each code word, the actual ten bits of the code word from the barrel shifter are input to address port 84. For subsequent code word processing cycles, multiplexer 88 couples the feedback data from terminals 90 instead of the code word data from the barrel shifter to address port inputs 5–9. During these subsequent processing cycles, new code word data from the barrel shifter is input to address port inputs 0–4 only.

The data is transmitted so that all PCM data is sent MSB first. The code words must be transmitted such that the Huffman code words are transmitted MSB first, followed by the rest of the code word and finally terminated with a sign bit. For code words processed by ROM 22 that are longer than ten bits, in which case multiple passes through the ROM will be required, the continue bit from the output of the ROM (or, in an alternate embodiment from the state machine) is input to MUX 88 via input terminal 92. The continue bit actuates the multiplexer to couple the feedback data instead of the actual code word data to the address port of the ROM. The continue bit is also input to address port 84a of the ROM to instruct the ROM to work from the second lookup table instead of the first lookup table for all lookups subsequent to the first lookup for a code word.

The shift length field in the ROM will always contain the length of the Huffman code word without its associated sign bit. If the code word to be processed is an end-of-block (EOB) word, a value of "0" is inserted for the shift length. This notifies the state machine to process an EOB. Since the shift length is used to notify the state machine of an EOB condition, the EOB code word length must be known ahead of time. The length of the EOB code word in the illustrated embodiment is three bits.

If the code word to be processed is one including the escape code prefix 60 illustrated in FIG. 4, a predetermined value (e.g., 12) is detected from the shift length field (RSL) of the ROM. This notifies the state machine to process an escape code one (ESC-1) code word. Since the shift length is used to notify the state machine of an ESC-1 condition, the length of the escape code prefix of the ESC-1 code word must be known ahead of time. The length of the escape code prefix in the illustrated embodiment is eight bits.

If the code word to be processed is one including the escape code prefix 70 illustrated in FIG. 5, a predetermined value (e.g., 13) is detected from the shift length field (RSL) of the ROM. This notifies the state machine to process an escape code two (ESC-2) code word. In the illustrated embodiment, the length of the escape code prefix for an ESC-2 code word is six bits.

If the code word to be processed is one of the special 11-bit code words, a predetermined value (e.g., 11) is detected from the shift length field of the ROM. This notifies the state machine to process the special 11-bit code word. Since the runlength for a special 11-bit code word is known ahead of time to be zero, another amplitude can be inserted into the runlength field and be selected by a multiplexer, depending on what the least significant bit (LSB) of the 11-bit word is.

The shift length field for any word that does not terminate during the current processing cycle is also set to a predetermined value (e.g., 15). All other words that could be processed by accident will be detected if the shift length field from the ROM is equal to another predetermined value (e.g., 14). This will inform the state machine that an invalid code word has been accessed.

Master control state machine 36 controls the action taken by the Huffman decoder. A block diagram illustrating the state machine in greater detail is provided in FIG. 7. The major components of the state machine are a master control module 110, pixel and block counters 106, 108, a header state machine 102, a quantization logic (QLOGIC) processor 104, and state machine output control logic generally designated 122.

The function of the master control module 110 is to keep a current status of the present state of the state machine and to determine which state to go to next. The control logic bases decisions on the current state of the state machine, data read from the ROM, the counters, data fed from the synchronization circuitry 16 (FIG. 1), and the input barrel shifter. All inputs from the synchronization circuitry are latched on the falling edge of the 14.6 MHz clock.

States are triggered by the control signals output from the master control module 110. Depending on the output of ROM 22, or the status of the incoming data (i.e., whether it is PCM or DPCM), the state machine within the master control module will decide the next state to proceed to. The next state of the master control state machine is based on decisions made on the current state, the data read from the counters, data read from ROM 22, and the data from the input barrel shifter received from barrel shifter output port 100. The master control module is responsible for resetting all of the counters upon a macroblock reset. It also provides a clock that drives the pixel counter 106. Master control module 110 also processes the runlengths associated with Huffman code words and escape code words, provides a six-bit location of the runlength counter and controls most of the output logic section of the Huffman decoder.

The ESC-1 code word takes two clock cycles to process. Upon the first clock cycle, the state machine just recognizes the escape code prefix of the ESC-1 code word, and dumps eight bits off of the barrel shifter. Also during this first clock cycle, a zero run coefficient is latched in the pipeline for output. This is because of the requirement that there must always be a coefficient produced every clock cycle without interruption. This requirement is met by the fact that there is always a zero amplitude coefficient associated with the ESC-1 code word. The second clock cycle of processing entails the extraction of the amplitude and runlength fields of the code word. Those skilled in the art will appreciate that the encoder must understand that the number of runlength zeros inserted into the six-bit field of the ESC-1 code word must be one less than it actually is due to the fact that the processing of the ESC-1 code word by the decoder sends out one zero coefficient (run coefficient) automatically.

Figure 7:
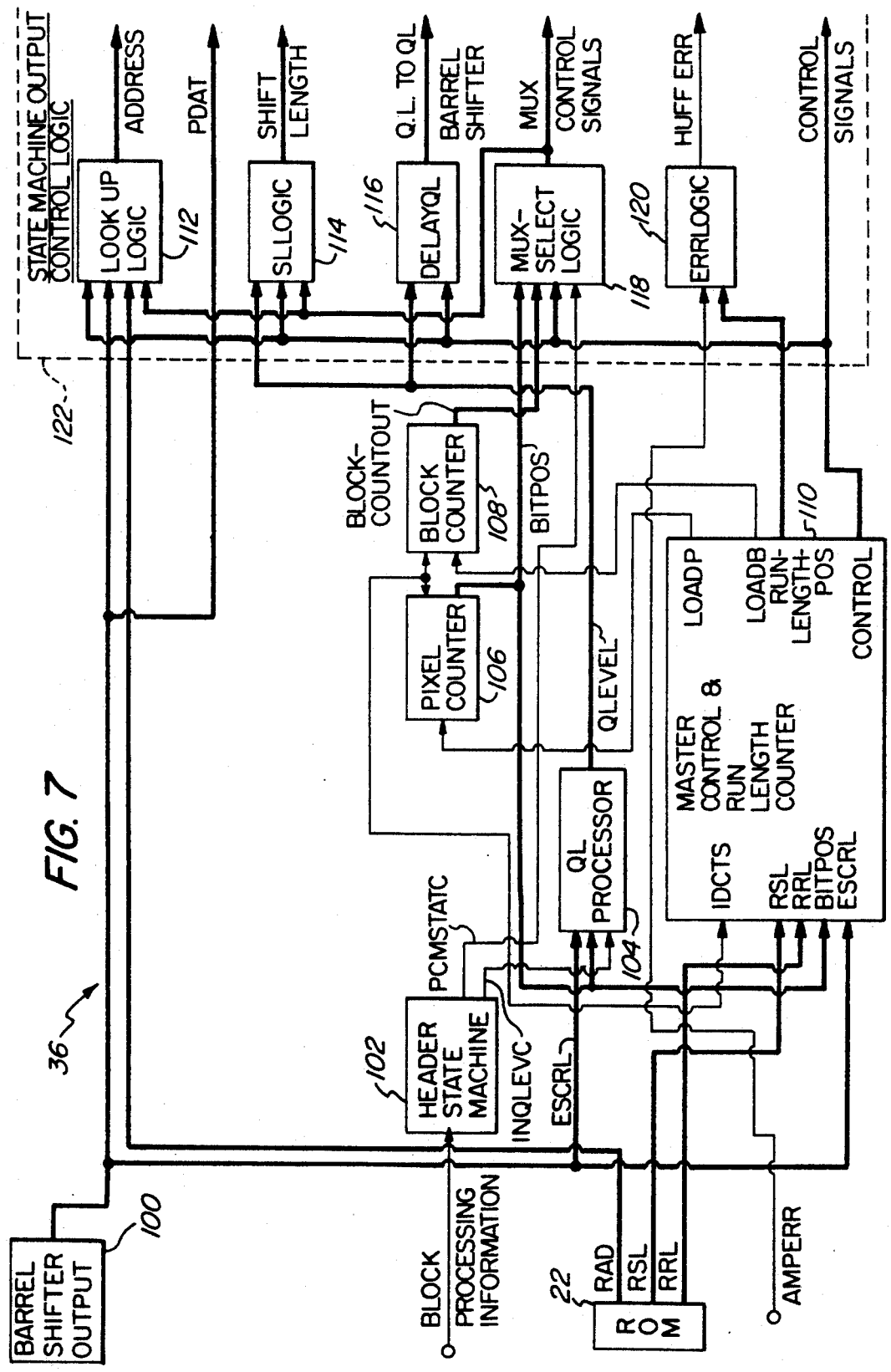
FIG. 7 is a detailed block diagram of the master control state machine subsystem of the decoder illustrated in FIG. 2.

The header state machine 102 illustrated in FIG. 7 is a state machine to read header data from the incoming serial data. The synchronization circuitry 16 (FIG. 1) is required to transmit the header information for each superblock before processing on that block begins. Thus, the serial header information for each superblock is sent during the processing of the previous superblock. This ensures that the header data is received in advance of when it is actually needed, allowing the Huffman decoder to continually process incoming data when enabled. The decoder internally keeps track of superblock boundaries so that it knows when to begin using the next packet of header information.

Quantization level processor 104 is responsible for inverse normalization of the decoded data. It produces a shift amount that is sent to the quantization level barrel shifter 28 (FIG. 2). The shift length is generated as a function of the quantization level stored in the header state machine, and the position of the pixel being processed. The pixel location is generated by a pixel counter 106. For ESC-1 code word amplitudes, the pixel location is generated by adding the runlength field of the ESC-1 code word to the current value of the pixel counter.

The pixel counter has two major functions. First, it keeps track of what pixel is being processed in an 8×8 block. This information is required by the quantization level processor 104 in order to enable inverse normalization. Second, the pixel counter is used to synchronize the IDCT circuitry 18 with the first coefficient of the 8×8 block.

A block counter 108 is used to latch the new quantization level (QLEVEL) information and PCM block information stored in the header state machine for use in processing the next superblock. It is also used in selecting PCM data from the barrel shifter depending on the current block and the status word for PCM blocks stored in the header state machine.

State machine output control logic 122 controls the data path of the decoded coefficients from the input barrel shifter and the ROM section of the Huffman decoder. It is also used to control state decisions in the master control module. The state machine output control logic includes lookup logic 112, shift length logic 114, quantization level delay logic 116, multiplexer select logic 118, and error logic 120. These components control corresponding components in the output logic 38 of the Huffman decoder illustrated in FIG. 2.

The error logic 120 detects various errors that can occur. The Huffman decoder will process a large amount of compressed information and expand it back out to an uncompressed form. Error detection is therefore imperative to maintain the integrity of the system. Error detection is generated in the state machine output control logic by combining the error generated from the quantization level barrel shifter with terms generated internally to the state machine. Upon detecting an error, error logic 120 outputs a HUFF_ERR signal that results in a video hold of the data in the superblock containing the error until the completion of the macroblock that the error occurred in. The synchronization circuitry 16 (FIG. 1) restarts the Huffman decoder every macroblock by outputting an MB_RESET signal every macroblock to ensure that the error does not propagate past this boundary.

The shift length sent to the barrel shifter from the state machine is calculated as a function of the current QLEVEL generated from the QL processor 104, and the ROM shift length. If the current code word being processed is a regular Huffman code word from the matrix of FIG. 8, then the ROM shift length is sent directly to the barrel shifter. If the code word is a multiple lookup (i.e., is greater than ten bits and not a special case 11-bit code word) a shift length of four is sent to the barrel shifter in the illustrated embodiment. The barrel shifter is designed to add one to the value of four, so that a total of five bits are shifted out. The code word is identified as a multiple lookup code word by containing a shift length of 15 in the shift length field of the ROM. As long as the code word requires additional lookups, a value of 15 will continue to be read from the ROM shift length field. The code word will be considered terminated when a value not equal to 15 is read from the ROM shift length field. When a multiple lookup word terminates, the shift length sent to the barrel shifter will be the shift length read from the ROM shift length field plus a value of five to account for the five bits not shifted off from the original ten-bit first lookup for the code word.

The address generated for the ROM 22 will be a function of the ROM output data, and the output of the barrel shifter. In accordance with the present invention, ROM 22 needs a storage capacity of only $2*2^n$ words, where n is the maximum number of bits (e.g., ten) that can be processed in a single pass through the ROM. It should be noted that n is also equal to the number of bits accommodated by the address port 84 of the ROM. Thus, in the illustrated embodiment, ROM 22 is a 2K ROM.

If the Huffman code word is not a multiple lookup, then the address generated for ROM 22 will come right off of the barrel shifter. If the Huffman code word is a multiple lookup, the address will be a combination of the data from the barrel shifter, and data latched from the output of the ROM. On the first lookup, ten bits will address the ROM. The continue bit input to address port 84a will be zero. If the decoded word from the ROM indicates an unterminated code word, five bits will be shifted off of the barrel shifter, and the five least significant bits (LSB) of the new ten-bit address from the barrel shifter will be combined with the five LSBs from the output of the ROM. At this point, the five LSBs from the previous lookup will be at the input of multiplexer 88, and ignored since the multiplexer will apply the "feedback" bits latched from the ROM during the prior ROM lookup to address inputs five through nine of address port 84. At the same time, the continue bit input to address port 84a (and to multiplexer 88) will be set to one. This process is repeated until the code word terminates. When the code word is terminated, the shift length field of the ROM plus five will be sent to the barrel shifter. The additional five bits account for the five bits at the input of multiplexer 88 that were ignored when the multiplexer input the feedback bits to address inputs five through nine of port 84.

Amplitude data for code words that include escape code prefixes 60 and 70 illustrated in FIGS. 4 and 5 will be pulled directly off of the barrel shifter. Since amplitude data is sent MSB first, it can be automatically denormalized without going through the quantization level barrel shifter 28 illustrated in FIG. 2. Instead, a bit masking process is used. Amplitude data is produced by masking the seven LSBs depending on the current quantization level generated by the quantization level processor 104. PCM data is fed to the output logic section 38 of the Huffman decoder via an eight-bit bus tap 31 from the barrel shifter.

Several examples of the decoding of Huffman code words using the novel ROM of the present invention will now be provided with reference to FIG. 6. In the first example, a code word of fewer than ten bits represented in the matrix of FIG. 8 is decoded. Such code words are processed with a single pass through the ROM. For example, assume that the nine-bit code word having runlength zero and amplitude 12 is to be processed. Initially, the continue bit at terminal 92 of the ROM will be set to zero, indicating that the first lookup table 80 is to be used. Multiplexer 88 will be set to couple data bits from the barrel shifter directly to address port 84. The nine-bit code word from the barrel shifter is input to address inputs zero through eight of address port 84, directly addressing a location in first lookup table 80. The lookup table will output four bits of amplitude data, four bits of runlength data (all zeros, i.e., 0000) and four bits of shift length data indicating that nine bits were shifted in from the barrel shifter. The amplitude and runlength data output from ROM 22 will be processed by the output logic 38 of the Huffman decoder (FIG. 2) to obtain the transform coefficients represented by the Huffman code word.

The next example describes the decoding of a 14-bit Huffman code word. Upon receipt of the code word, the first ten bits are input to address inputs zero through nine of address port 84. These ten bits will address a location of the first lookup table 80 that outputs a shift length of 15. A shift length value of 15 indicates to the state machine that a multiple lookup will be required for this code word. The state machine detects the shift length 15 value during the first clock cycle, and in response sends a shift length of five to the barrel shifter. At the same time, the master control state machine 36 asserts an output MUX control signal to multiplexer 32 (FIG. 2), causing the multiplexer to output a zero run coefficient (e.g., 0000) for the cycle. This enables the decoder to produce one coefficient each cycle of the data clock, even when it takes more than one cycle to process a particular code word.

Upon receiving the shift length of five from the state machine, the barrel shifter 20 loads the next five bits of the code word into address inputs zero through four of address port 84. At the same time, feedback data (instead of actual amplitude and runlength data) that is output from first lookup table 80 during the first cycle of the code word processing is fed back to terminals 90 and input via multiplexer 88 to address inputs five through nine of address port 84. Multiplexer 88 will respond to the assertion of the continue bit on terminal 92 in order to transfer the feedback data instead of the data from the barrel shifter to address port 84. The continue bit can either be a bit output from ROM lookup table 80 or a bit generated by the state machine in response to the shift length value 15 output from the ROM.

At this point, four new bits from the barrel shifter (the remaining four bits in the 14-bit code word) and five feedback bits will address the second lookup table 82 of the ROM. Access to the second lookup table 82 is provided by the input of the continue bit to address port 84a of the ROM. The four new bits from the barrel shifter and five feedback bits input to address port 84 will point to a value in lookup table 82 that outputs the proper amplitude and runlength data for the 14-bit code word. At the same time, the ROM will output a valid shift length of between two and ten, indicating to the state machine that the code word has been successfully decoded so that the system can be reset to commence processing of the next code word.

Code words of greater than 15 bits will be processed in three cycles. The first cycle will provide feedback data from the first lookup table 80 for use during the second cycle. The second cycle will output feedback data from second lookup table 82 for use during the third cycle. The third cycle will result in the output of the actual amplitude and runlength data for the code word from lookup table 82. During each of the first two cycles, the state machine will output a zero run coefficient via multiplexer 32 so that the requirement of producing one coefficient for each cycle of the data clock will be satisfied.

Figure 9:
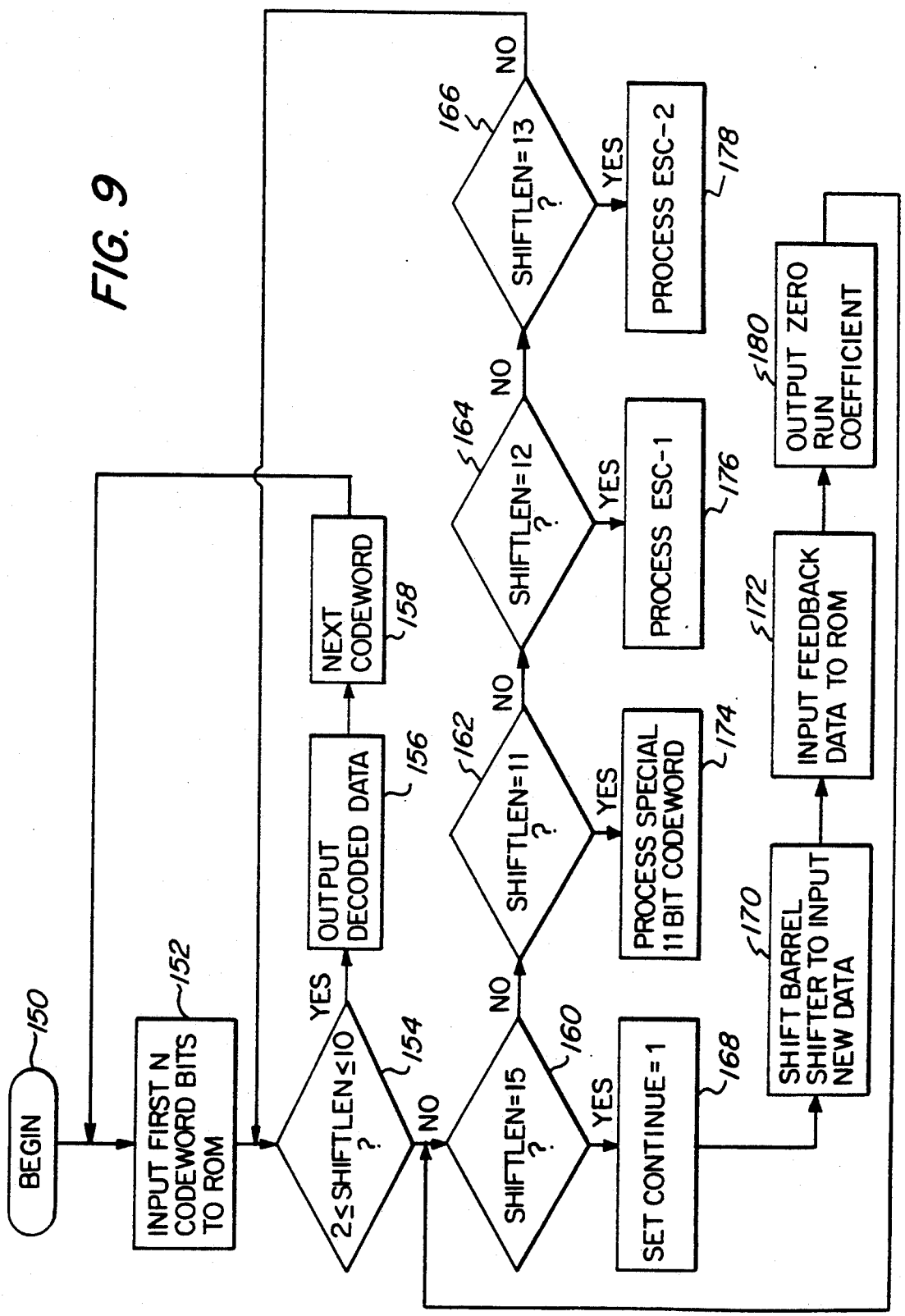
FIG. 9 is a flowchart illustrating the decoding of code words in accordance with the present invention.

A flowchart summarizing the code word decoding operation is provided in FIG. 9. The decoding process commences at box 150, and at box 152 the first N code word bits of a new code word are input to the ROM address port. In the illustrated embodiment, N=10, although it should be appreciated that any value could be chosen for N depending upon the specific decoder implementation.

In response to the first ten code word bits, the decoder of the illustrated embodiment will output data from the first lookup table 80, including shift length data. If the code word is no more than ten bits, the shift length (SHIFTLEN) output from the first lookup table will range from two to ten. In this event, the first lookup table will output the actual amplitude and runlength data for the code word, as indicated at box 156, and the decoder will be ready to process the next code word as indicated at box 158. Control is then returned to box 152 for decoding of the next code word.

In the event that the SHIFTLEN output from the first lookup table is not in the range of two to ten, a determination is made at box 160 as to whether the SHIFTLEN equals 15. A shift length of 15 indicates that the code word is greater than ten bits in length, and will require at least one additional pass through the ROM. This occurrence will result in setting the continue bit to one at box 168, indicating to the ROM that the second lookup table 82 must be used and setting multiplexer 88 to input feedback data to the address inputs five to nine of address port 84. Then, at box 170, the barrel shifter is shifted the amount necessary to input the next five bits of new data to address inputs zero to four of address port 84. In order to accomplish this, the barrel shifter will be shifted by five bits on the second pass through the ROM, and by five bits for each subsequent pass after the second pass. At box 172, the feedback data output from the ROM during the last pass therethrough is input via multiplexer 88 to the ROM address port. The new input data from the barrel shifter and feedback data from the ROM will address a new memory location in ROM 22, and the resultant output data from the ROM will contain a new shift length. At the same time, a zero run coefficient will be output from multiplexer 32 in response to the state machine, as indicated at box 180. The routine then loops back to box 160.

Box 160 again determines if the shift length is equal to 15, and if it is, subsequent passes through the ROM continue until the shift length no longer equals 15. At this point, box 162 will determine if the shift length equals 11. If so, the code word is one of the special 11-bit code words that can be processed outside of the ROM. Such processing occurs at box 174.

If the shift length does not equal 11, a determination is made at box 164 as to whether the shift length equals 12. If so, it means that the code word is an ESC-1 code word, and is processed accordingly at box 176. If the shift length does not equal 12, box 166 determines if the shift length equals 13. If so, it means that the code word is an ESC-2 code word, which is processed at box 178.

In the event that the shift length is not 11, 12, 13 or 15, a determination is made at box 154 as to whether the shift length is in the range from two to ten, indicating that the code word has been successfully decoded. Assuming that it is, the decoded data is output at box 156 and processing of the next code word commences at box 158.

It should now be appreciated that the present invention provides a decoder for decoding variable length code words to recover transform coefficients. A small ROM size is provided by utilizing feedback to process code words of a length greater than could otherwise be accommodated by a small (e.g., 1K) lookup table. If a code word is less than the predetermined number of bits, it will be decoded in one clock cycle. If the code word is longer than the predetermined number of bits, it will be decoded in more than one clock cycle. For each extra clock cycle required to decode the code word, a run coefficient equal to zero is output, so that one coefficient is produced for each clock cycle. This enables the decoder to process code words at real time video rates.

Although the invention has been described in connection with a specific embodiment thereof, those skilled in the art will appreciate that numerous adaptations and modifications may be made thereto without departing from the spirit and scope of the invention as set forth in the claims.

What is claimed is:

1. Apparatus for decoding variable length code words to recover transform coefficients, said code words having the property that no code word is a prefix of any other code word, a first category of said code words having a length of no more than n bits and a second category of said code words having a length of greater than n bits, said apparatus comprising:
   memory means having:
   an n bit address port,
   a first plurality of addressable memory locations containing amplitude, runlength and first control data for different code words, and
   a second plurality of addressable memory locations containing feedback and second control data for portions of code words from said second category;
   means for decoding code words from said first category by inputting the code words to said address port for addressing said memory to output amplitude, runlength, and first control data therefor; and
   means for decoding code words from said second category by:
   inputting a first n bit portion of a second category code word to said address port for addressing said memory to output feedback and second control data therefor;

cyclically inputting a subsequent portion of said second category code word to said address port together with said feedback data in response to said second control data, said subsequent portion and feedback data together providing an address of no more than n bits for addressing said memory to:
  (i) output feedback and second control data for use in a next input cycle when at least one additional portion remains in said second category code word, and
  (ii) output amplitude, runlength and first control data for said second category code word when no additional portions remain therein; and means responsive to said second control data for outputting a run coefficient for each portion of said second category code word that does not result in the output of amplitude, runlength and first control data.

2. Apparatus in accordance with claim 1 further comprising:
clock means coupled to provide a clock signal to said memory means and said first and second category code word decoding means, for establishing successive clock cycles during which at least one of:
  (i) amplitude, runlength and first control data for producing an amplitude coefficient, and
  (ii) feedback and second control data for producing a run coefficient is output from said memory means;
whereby a coefficient is produced from the variable length code words for every clock cycle.

3. Apparatus in accordance with claim 1 wherein said second category code word decoding means comprise:
multiplexer means responsive to said second control data for inputting feedback data for a second category code word to a predetermined plurality of address port inputs instead of inputting code word data to said inputs, with a remaining plurality of address port inputs receiving a corresponding portion of the second category code word.

4. Apparatus in accordance with claim 3 wherein said feedback data has a bit length of n/2 and said corresponding portion of the second category code word has a bit length of no more than n/2.

5. Apparatus in accordance with claim 1 further comprising:
means for detecting special case code words for which amplitude and runlength data is not provided in said memory means, and
means responsive to said detecting means for decoding said special case code words.

6. Apparatus in accordance with claim 1 wherein said memory means have a storage capacity that is substantially equal to $2 \times 2^n$.

7. Apparatus in accordance with claim 1 wherein:
said subsequent portion of said second category code word has a bit length that is the lesser of the number of unprocessed bits remaining in the code word or n/2; and
said feedback data has a bit length of n/2.

8. Apparatus in accordance with claim 1 wherein said memory means are configured as:
a first lookup table containing:
  the addressable memory locations in the first plurality thereof that correspond to said first category code words, and
  the addressable memory locations in the second plurality thereof that correspond to the first n bit portions of said second category code words; and
a second lookup table containing:
  the addressable memory locations in the first plurality thereof that correspond to said second category code words, and
  the addressable memory locations in the second plurality thereof that correspond to the subsequent portions of said second category code words.

9. Apparatus in accordance with claim 8 wherein said memory means comprise an additional address port for receiving a control bit that selectively couples data at said n bit address port to address either said first lookup table or to said second lookup table.

10. Apparatus in accordance with claim 9 wherein said first and second lookup tables each have a storage capacity of substantially $2^n$ words.

11. Apparatus in accordance with claim 1 further comprising a barrel shifter having:
an input for receiving said code words, and
means responsive to shift length information derived from said first control data and said second control data for outputting code words and portions thereof to said n bit address port.

12. Apparatus in accordance with claim 11 wherein said shift length information is indicative of whether the decoding of a code word has been completed, said apparatus further comprising:
means responsive to said shift length information for initiating the decoding of a new code word.

13. Apparatus in accordance with claim 1 wherein said code words are Huffman code words derived from discrete cosine transform coefficients.

14. A feedback memory for use in decoding variable length code words comprising:
a first lookup table addressable by first code words of no more than n bits in length or by up to the first n bits of second code words exceeding n bits in length; and
a second lookup table addressable by a combination of p bits of feedback data and an m bit or smaller portion of a second code word, where $p+m \leq n$ and said m bit or smaller portion follows the first n bits of said second code words;
wherein said first lookup table contains:
  decoded data corresponding to said first code words, and
  feedback data corresponding to an initial n bit or smaller portion of said second code words; and
said second lookup table contains:
  decoded data corresponding to a final m bit or smaller portion of said second code words; and
  feedback data corresponding to any m bit portions of said second code words that reside between said initial and final portions thereof.

15. A memory in accordance with claim 14 further comprising:
an n-bit address port for receiving code words and feedback data; and
means for selectively coupling said address port to address said first lookup table or said second lookup table.

16. A memory in accordance with claim 14 wherein said decoded data comprises amplitude and runlength data.

17. A method for decoding a plurality of successive variable length code words, including code words that represent events of zero runlength, comprising the steps of:

decoding first code words of up to n bits in length in a single clock cycle;

decoding second code words of greater than n bits in length in a plurality P of clock cycles, said second code words representing events having runlengths of at least P−1;

identifying third code words that represent events of zero runlength with a special escape code; and decoding said third code words in one clock cycle in response to the detection of said special escape code.

18. A method in accordance with claim 17 wherein:

said first and second code words are decoded using a lookup table to provide corresponding amplitude and runlength data; and said third code words are decoded by directly outputting amplitude data without reference to said lookup table.

19. Apparatus for decoding variable length code words to provide output codes representative of fully decoded code words, said code words having the property that no code word is a prefix of any other code word, a first category of said code words having a length of nor more than n bits and a second category of said code words having a length of greater than n bits, said apparatus comprising:

memory means having:
an n bit address port,
a first plurality of addressable memory locations containing first control data and decoded data for different code words, said decoded data being used to form said output codes, and
a second plurality of addressable memory locations containing feedback and second control data for portions of code words from said second category;

means for decoding code words from said first category by inputting the code words to said address port for addressing said memory to output a complete output code and first control data therefor; and means for decoding code words from said second category by:

inputting a first n bit portion of a second category code word to said address port for addressing said memory to output feedback and second control data therefor;

cyclically inputting a subsequent portion of said second category code word to said address port together with said feedback data in response to said second control data, said subsequent portion and feedback data together providing an address of nor more than n bits for addressing said memory to:

(i) output feedback and second control data for use in a next input cycle when at least one additional portion remains in said second category code word, and (ii) output first control data and complete the output of an output code for said second category code word when no additional portions remain herein;

wherein said responsive to said second control data are provided for outputting a portion of an output code for each portion of said second category code word that does not result in the output of said first control data and the completion of an output code.

* * * * *